(12) United States Patent
Ramalingam et al.

(10) Patent No.: US 12,368,033 B2
(45) Date of Patent: *Jul. 22, 2025

(54) METHODS AND APPARATUS FOR PHYSICAL VAPOR DEPOSITION (PVD) DIELECTRIC DEPOSITION

(71) Applicant: APPLIED MATERIALS, INC., Santa Clara, CA (US)

(72) Inventors: Jothilingam Ramalingam, Milpitas, CA (US); William Fruchterman, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/536,612

(22) Filed: Dec. 12, 2023

(65) Prior Publication Data

US 2024/0105433 A1 Mar. 28, 2024

Related U.S. Application Data

(63) Continuation of application No. 16/994,616, filed on Aug. 16, 2020, now Pat. No. 11,842,890.

(60) Provisional application No. 62/887,853, filed on Aug. 16, 2019.

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01); *H01J 37/3447* (2013.01)

(58) Field of Classification Search
None
See application file for complete search history.

(56) References Cited

U.S. PATENT DOCUMENTS

| | | | |
|---|---|---|---|
| 6,149,784 A | 11/2000 | Su et al. | |
| 6,168,696 B1 | 1/2001 | Burton et al. | |
| 7,026,009 B2 | 4/2006 | Lin et al. | |
| 11,842,890 B2* | 12/2023 | Ramalingam | H01J 37/3441 |
| 2002/0144889 A1 | 10/2002 | Tao et al. | |
| 2003/0026917 A1* | 2/2003 | Lin | H01J 37/32458 |
| | | | 427/446 |
| 2007/0003730 A1* | 1/2007 | Kojima | G11B 7/266 |
| 2012/0006675 A1 | 1/2012 | Yamamoto | |
| 2013/0017690 A1 | 1/2013 | Takatsuki et al. | |
| 2014/0054164 A1 | 2/2014 | Yamaguchi et al. | |

(Continued)

FOREIGN PATENT DOCUMENTS

JP 11236667 A 8/1999

OTHER PUBLICATIONS

International Search Report for PCT/US2020/048591 dated Nov. 13, 2020.

*Primary Examiner* — Jason Berman
(74) *Attorney, Agent, or Firm* — Moser Taboada

(57) ABSTRACT

Methods and apparatus for reducing burn-in time of a physical vapor deposition shield, including: sputtering a dielectric target having a first dielectric constant to form a dielectric layer upon an inner surface of a shield, wherein the shield includes an aluminum oxide coating having a second dielectric constant in an amount sufficient to reduce the burn-in time, and wherein the first dielectric constant and second dielectric constant are substantially similar.

5 Claims, 3 Drawing Sheets

(56) References Cited

U.S. PATENT DOCUMENTS

| | | | |
|---|---|---|---|
| 2015/0075714 A1* | 3/2015 | Sun | C23C 4/10 427/446 |
| 2017/0145553 A1 | 5/2017 | Lie et al. | |
| 2017/0323768 A1 | 11/2017 | Zhang et al. | |
| 2018/0100228 A1 | 4/2018 | Sun et al. | |

* cited by examiner

300

```
┌─────────────────────────────────────┐
│  PRIOR TO BURN-IN: COATING AN INNER │
│  SURFACE OF A SHIELD WITH ALUMINUM  │
│  OXIDE TO PRODUCE AN ALUMINUM OXIDE │─── 302
│  COATING HAVING A PREDETERMINED     │
│        DIELECTRIC CONSTANT.         │
└─────────────────────────────────────┘
```

```
┌─────────────────────────────────────┐
│   SPUTTERING A DIELECTRIC TARGET    │
│  HAVING A FIRST DIELECTRIC CONSTANT │
│  TO FORM A DIELECTRIC LAYER UPON AN │
│  INNER SURFACE OF A SHIELD, WHEREIN │
│   THE SHIELD COMPRISES AN ALUMINUM  │
│     OXIDE COATING HAVING A SECOND   │
│   DIELECTRIC CONSTANT IN AN AMOUNT  │─── 402
│    SUFFICIENT TO REDUCE THE BURN-IN │
│     TIME, AND WHEREIN THE FIRST     │
│   DIELECTRIC CONSTANT AND SECOND    │
│      DIELECTRIC CONSTANT ARE        │
│         SUBSTANTIALLY SIMILAR       │
└─────────────────────────────────────┘
```

FIG. 4

METHODS AND APPARATUS FOR PHYSICAL VAPOR DEPOSITION (PVD) DIELECTRIC DEPOSITION

CROSS-REFERENCE TO RELATED APPLICATIONS

This application is a continuation of U.S. patent application Ser. No. 16/994,616, filed on Aug. 16, 2020, issued as U.S. Pat. No. 11,842,890, on Dec. 12, 2023, which claims benefit of U.S. provisional patent application Ser. No. 62/887,853, filed Aug. 16, 2019 which is herein incorporated by reference in its entirety.

FIELD

Embodiments of the present disclosure relate to methods and apparatus for processing substrates in a physical vapor deposition chamber. Particularly, embodiments of the present disclosure relate to methods and apparatus for physical vapor deposition (PVD) dielectric deposition.

BACKGROUND

In semiconductor processing, physical vapor deposition (PVD) is a process for depositing a thin film. A PVD process generally includes bombarding a target including a source material with ions from a plasma, causing the source material to be sputtered from the target. The ejected source material is then accelerated towards a substrate being processed via a voltage bias, resulting in a deposition of the source material with or without reaction with other reactants.

The PVD process has been used to deposit dielectric materials with low contamination resulting in high quality films. However, depositing dielectric material in a PVD chamber is accompanied by inner surfaces of the PVD chamber being slowly coated by a non-conductive dielectric material. An inner shield may be provided to maintain the inner surfaces of a PVD chamber conductive during deposition of dielectric materials. However, because inner shields such as aluminum shields of PVD chambers function as system anodes during processing, the inventors have observed that dielectric material having a dielectric constant different than the dielectric constant of the target material problematically deposits upon the inner surfaces of the shield causing variation in circuit impedance and voltage distribution. The dielectric constant difference between the coating and target may also change plasma distribution inside the PVD chamber thus negatively impacts deposition rate and uniformity of film thickness. Ultimately, a large dielectric constant difference between a coating layer inside a shield and a target may even cause circuit interruption and disappearing anode problems.

Moreover, the inventors have observed that a problematic long burn-in time for the first use of a PVD chamber is needed to reduce the difference in the dielectric constant of the deposited dielectric coating on the interior of a shield to that of a target. For example, a new PVD chamber may require about 20 kilowatt hours of burn-in time before the dielectric constant of a coating inside a shield approaches the dielectric constant of the target. The lengthy burn-in time may delay production by weeks.

Further, the inventors have observed that coating the inside of the shield with the target material is not always practical. For example, where the target material is expensive, such as when using targets suitable for forming ovonic threshold switch (OTS) layers which typically include a compound of germanium (Ge), arsenic (As), and selenium (Se), the high cost of the deposited material upon the interior of a shield is problematic.

Thus, there is a need for methods and apparatus for reducing the preconditioning burn-in time of a PVD chamber and/or matching the dielectric constant of a material deposited upon the inner surfaces of a shield to that of a target.

SUMMARY

Methods and apparatus for reducing burn-in time of a physical vapor deposition shield or matching the dielectric constant of a physical vapor deposition shield to that of a target are provided herein. In some embodiments, a method for reducing burn-in time of a physical vapor deposition shield, includes: sputtering a dielectric target having a first dielectric constant to form a dielectric layer upon an inner surface of a shield, wherein the shield includes an aluminum oxide coating having a second dielectric constant in an amount sufficient to reduce the burn-in time, and wherein the first dielectric constant and second dielectric constant are substantially similar.

In some embodiments, a physical vapor deposition assembly, includes, prior to burn-in: a dielectric target having a first dielectric constant; a shield for reducing burn-in time prior to sputtering, including: an aluminum oxide coating disposed upon an inner surface of a shield, wherein the shield has a second dielectric constant substantially similar to the first dielectric constant.

In some embodiments, a method of preparing a shield surface prior to using a shield for sputtering, includes, prior to burn-in: coating an inner surface of a shield with aluminum oxide to produce an aluminum oxide coating having a predetermined dielectric constant.

In some embodiments, a computer readable medium is provided having instructions stored thereon which, when executed, cause a physical vapor deposition chamber to perform a method for reducing burn-in time of a physical vapor deposition shield. In some embodiments, the method includes: sputtering a dielectric target having a first dielectric constant to form a dielectric layer upon an inner surface of a shield, wherein the shield comprises an aluminum oxide coating having a second dielectric constant in an amount sufficient to reduce the burn-in time, and wherein the first dielectric constant and second dielectric constant are substantially similar.

In some embodiments, a computer readable medium is provided having instructions stored thereon which, when executed, cause a semiconductor processing chamber to perform a method for preparing a shield surface prior to using a shield for sputtering. In some embodiments the method includes: coating an inner surface of a shield with aluminum oxide to produce an aluminum oxide coating having a predetermined dielectric constant. The predetermined dielectric constant may be substantially similar to a dielectric constant of a material to be sputtered in a subsequent deposition process, such as any of the processes disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 depicts a flow chart for a method of preparing a shield surface prior to using the shield for sputtering.

FIG. 4 depicts a flow chart for a method of reducing burn-in time of a physical vapor deposition shield.

Figure 1:
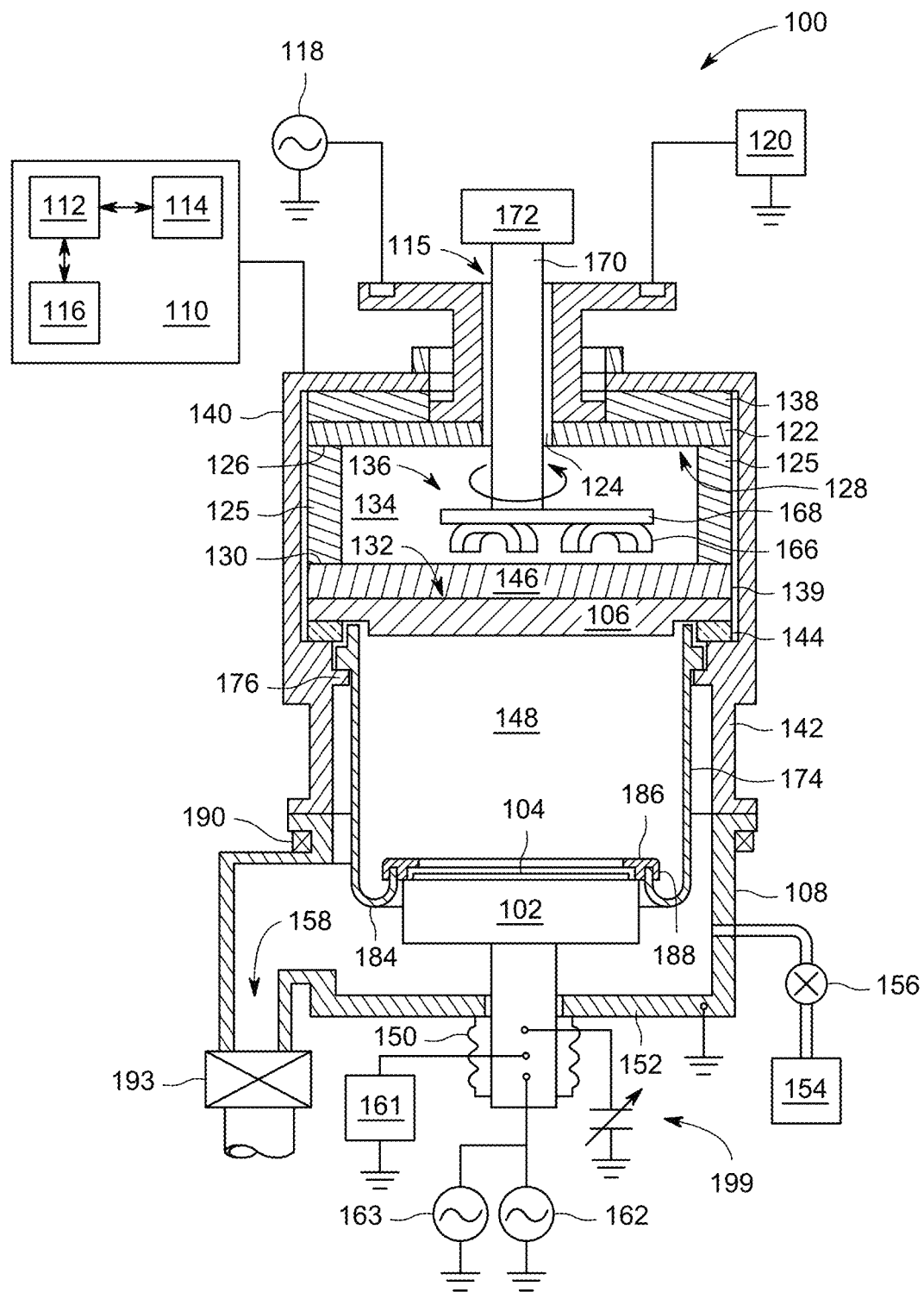
FIG. 1 depicts a schematic, cross-sectional view of a physical vapor deposition (PVD) chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for reducing burn-in time of a physical vapor deposition (PVD) shield or matching the dielectric constant of a PVD shield to that of a target are provided herein. In some embodiments, a method for reducing burn-in time of a PVD shield, includes: sputtering a dielectric target having a first dielectric constant to form a dielectric layer upon an inner surface of a shield, wherein the shield includes an aluminum oxide coating having a second dielectric constant in an amount sufficient to reduce the burn-in time, and wherein the first dielectric constant and second dielectric constant are substantially similar. The inventors have observed that by matching or substantially matching the dielectric constant of a coating layer formed inside a shield to that of certain dielectric target materials such as target material suitable for forming an ovonic threshold switch (OTS) layer including compounds of germanium (Ge), arsenic (As), and selenium (Se), that that burn-in time for a new shield is significantly reduced enabling increased processing of semiconductor substrates. Other benefits of the present disclosure include a shield pre-coated with aluminum oxide that can effectively reduce the generation of contaminating particles on the substrate surface without significantly increasing the processing or hardware cost. Particularly, in some embodiments, the coating layer includes aluminum oxide material have substantially similar or the same dielectric constant as the sputtering target or the film layer to be formed on the substrate surface. The deposition process using the shield of the present disclosure increases throughput performance of the chamber by reducing burn-in time from about 20 kilowatt hours to about 2-3 kilowatt hours readying a chamber for first production in a shortened period of time such as days.

FIG. 1 depicts a schematic, cross-sectional view of a PVD chamber (processing chamber 100) having a pretreated shield to reduce burn-in time in accordance with some embodiments of the present disclosure. The configuration of the PVD chamber is illustrative and PVD chambers, or other process chambers, having other configurations may also benefit from modification in accordance with the teachings provided herein. Examples of suitable PVD chambers that may be adapted to benefit from the present disclosure include any of the CIRRUS®, AURA®, or AVENIR® lines of PVD processing chambers, commercially available from Applied Materials, Inc., of Santa Clara, CA.

The process chamber 100 contains a substrate support pedestal 102 for receiving a substrate 104 thereon, and a sputtering source, such as a target 106. The substrate support pedestal 102 may be located within a grounded enclosure, which may be a chamber wall (e.g., chamber wall 108), a grounded shield (e.g., ground shield 140), or the like. Grounded shield 140 is shown covering at least some portions of the process chamber 100 above the target 106. In some embodiments, the ground shield 140 can be extended below the target to enclose the substrate support pedestal 102.

In some embodiments, the process chamber 100 includes a feed structure for coupling RF and DC energy to the target 106. The feed structure is an apparatus for coupling RF and DC energy to the target, or to an assembly containing the target, for example, as described herein. A first end of the feed structure can be coupled to an RF power source 118 and a DC power source 120, which can be respectively utilized to provide RF and DC energy to the target 106. For example, in some embodiments, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 118 and the DC power source 120.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1.

Providing a ratio of at least 1:1 or longer provides for more uniform RF delivery from the feed structure (i.e., the RF energy is more uniformly distributed about the feed structure to approximate RF coupling to the true center point of the feed structure). In embodiments, the inner diameter of the feed structure may be as small as possible, for example, from about 1 inch to about 6 inches, or about 4 inches in diameter. Providing a smaller inner diameter facilitates improving the length to ID ratio without increasing the length of the feed structure.

In embodiments, the second end of the feed structure may be coupled to a source distribution plate 122. The source distribution plate includes a hole 124 disposed through the source distribution plate 122 and aligned with a central opening of the feed structure. The source distribution plate 122 may be fabricated from suitable conductive materials to conduct the RF and DC energy from the feed structure.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body via the hole 124 of the source distribution plate 122. The cavity 134 and the central opening 115 of the body may be utilized to at least partially house one or more portions of a rotatable magnetron assembly 136. In some embodiments, the cavity may be at least partially filled with a cooling fluid, such as water ($H_2O$) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 140 and may be an integral part of the ground shield 140 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thus improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

The target 106 may be supported on a grounded conductive aluminum adapter 142 through a dielectric isolator 144. In embodiments, the target 106 includes a dielectric material to be deposited on the substrate 104 during sputtering. Non-limiting examples of suitable dielectric materials include material suitable for forming an ovonic threshold switch (OTS) layer including a compound of germanium (Ge), arsenic (As), and selenium (Se) such as $Ge_x$ and $Se_{1-x}$, wherein x is greater than 0 and smaller than 1, $Ga_2Te_3$, $In_2Te_3$, or $As_2Se_3$. In some embodiments, materials suitable for use as dielectric target material include dielectric materials having a dielectric constant between 10 and 12, such as ovonic threshold switch (OTS) layer material including a compound of germanium (Ge), arsenic (As), and selenium (Se) having a dielectric constant between 10 and 12. In embodiments, dielectric constant may refer to a ration of the permittivity of a substance to the permittivity of free space, or an expression of the extent a material concentrates electric flux.

In some embodiments, the backing plate 146 may be coupled to the source distribution plate-facing surface 132 of the target 106. The backing plate 146 may include a conductive material, such as copper-zinc, copper-chrome, or the same material as the target, such that RF and DC power can be coupled to the target 306 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a central region 148 of the process chamber 100. The central region 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of the process chamber 100 and thereafter raised to a deposition, or processing position. One or more processing gases may be supplied from a gas source 154 through a mass flow controller 156 into the lower part of the process chamber 100. An exhaust port 158 may be provided and coupled to a pump (not shown) via a valve 193 for exhausting the interior of the process chamber 100 and facilitating maintaining a desired pressure inside the process chamber 100.

An RF bias power source 162 may be coupled to the substrate support pedestal 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHZ, for example, non-limiting frequencies such as 2 MHZ, 13.56 MHZ, or 60 MHz can be used. Further, a second RF bias power source 163 may be coupled to the substrate support pedestal 102 and provide any of the frequencies discussed above for use with the RF bias power source 162. In other applications, the substrate support pedestal 102 may be grounded or left electrically floating. For example, a capacitance tuner 199 may be coupled to the substrate support pedestal for adjusting voltage on the substrate 104 for applications where RF bias power may not be desired. In some embodiments, a DC power supply 161 may be coupled to the substrate support pedestal 102 for adjusting voltage on the substrate 104 for applications where RF bias power and/or other methods of adjusting voltage on the substrate 104 are not desired.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the process chamber 100 and the substrate 104 as illustrated in FIG. 1. However, the design of the magnetron assembly is merely one exemplary embodiment. For example, other designs may include a rotatable magnetron assembly that is disposed off axis with respect to the central axis of the chamber and the substrate.

A motor 172 can be coupled to the upper end of the rotation shaft 170 to drive rotation of the magnetron assembly 136. The magnets 166 produce a magnetic field within the process chamber 100, generally parallel and close to the surface of the target 106 to trap electrons and increase the local plasma density, which in turn increases the sputtering rate. The magnets 166 produce an electromagnetic field around the top of the process chamber 100, and magnets 166 are rotated to rotate the electromagnetic field which influences the plasma density of the process to more uniformly sputter the target 106. For example, the rotation shaft 170 may make about 0 to about 150 rotations per minute.

In some embodiments, the process chamber 100 may further include a process kit shield such as shield 174 connected to a ledge 176 of the adapter 342. The adapter 142 in turn is sealed and grounded to the chamber sidewall (enclosure wall 108). Generally, the process kit shield such as shield 174 extends downwardly along the walls of the adapter 142 and the chamber wall 108 downwardly to below an upper surface of the substrate support pedestal 102 and returns upwardly until reaching an upper surface of the substrate support pedestal 102 (e.g., forming a u-shaped portion 184 at the bottom). Alternatively, the bottommost portion of the process kit shield need not be a u-shaped portion 184 and may have any suitable shape. A cover ring 186 rests on the top of an upwardly extending lip 188 of the process kit shield such as shield 174 when the substrate support pedestal 102 is in a lower, loading position but rests on the outer periphery of the substrate support pedestal 102 when the substrate support pedestal 102 is in an upper, deposition position to protect the substrate support pedestal 102 from sputter deposition. An additional deposition ring (not shown) may be used to shield the periphery of the substrate 304 from deposition. In embodiments, shield 174 includes a coating layer prior to burn-in configured to reduce the burn-in time thereof. In embodiments, the coating layer comprises or consists of aluminum oxide. Some embodiments of shield 174 are described with respect to FIG. 2 below.

In some embodiments, a magnet 190 may be disposed about the process chamber 100 for selectively providing a magnetic field between the substrate support pedestal 102 and the target 306. For example, as shown in FIG. 1, the magnet 190 may be disposed about the outside of the chamber wall in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

A controller 310 may be provided and coupled to various components of the process chamber 100 to control the operation thereof. The controller 110 includes a central processing unit (CPU) 112, a memory 114, and support circuits 116. The controller 110 may control the process chamber 100 directly, or via computers (or controllers) associated with particular process chamber and/or support system components. The controller 110 may be one of any form of general-purpose computer processor that can be used in an industrial setting for controlling various chambers and sub-processors. The memory, or computer readable medium, 114 of the controller 110 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 116 are coupled to the CPU 112 for supporting the processor in a conventional manner. These circuits include cache, power supplies, clock circuits, input/output circuitry and subsystems, and the like. Inventive methods as described herein may be stored in the memory 114 as software routine that may be executed or invoked to control the operation of the process chamber 100 in the manner described herein. The software routine may also be stored and/or executed by a second CPU (not shown) that is remotely located from the hardware being controlled by the CPU 112.

Figure 2:
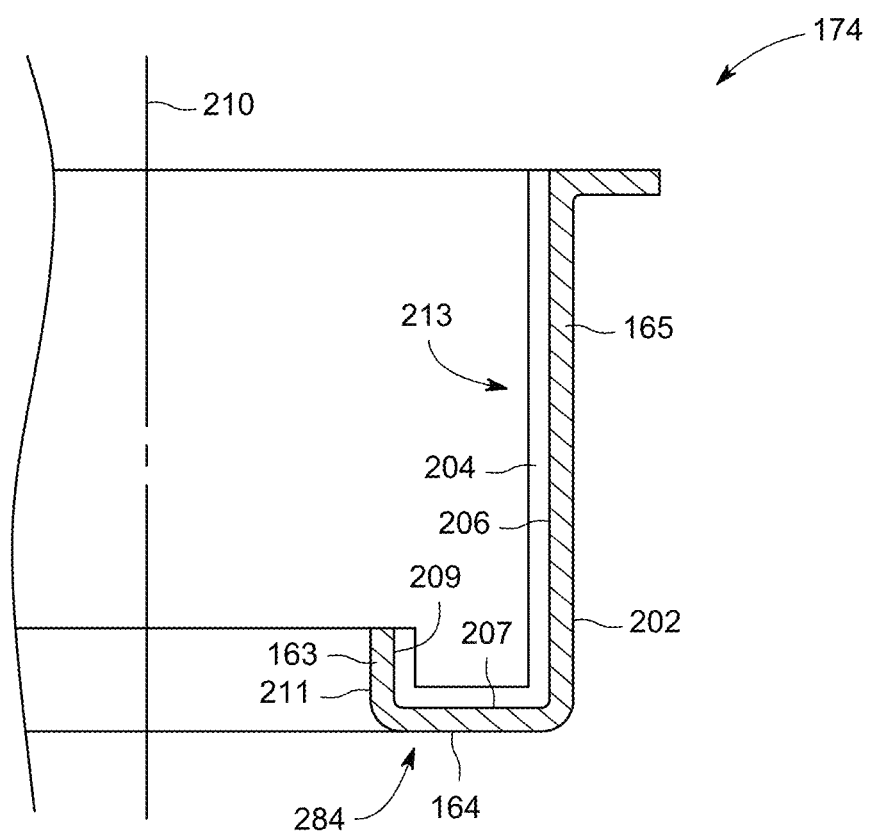
FIG. 2 depicts a schematic, cross-sectional view of a shield in accordance with some embodiments of the present disclosure.

FIG. 2 depicts a schematic, cross-sectional view of a portion of the shield 174 according to embodiments of the present disclosure. In embodiments, the shield 174 has a hollow body 202. The hollow body 202 has a cylindrical shape that is substantially symmetric about a central axis 210 of the shield 174. The hollow body 202 is axially aligned the central axis of the processing chamber 100. In embodiments, the shield 174 has a first annular leg 265, a second annular leg 263, and a horizontal leg 264. The horizontal leg 264 is radially extended and connects the second annular leg 263 to the first annular leg 265 at the lower portion of the first annular leg 265. The second annular leg 263 is relatively shorter than the first annular leg 265, forming a U- or L-shaped portion at the bottom 284 of the shield 174. Alternatively, the bottom-most portion of the shield 174 need not be a U-shaped, and may have another suitable shape.

In embodiments, the body 202 of the shield 174 may be fabricated from a single mass of material to form a one-piece body or two or more components welded together to form a one piece body. Providing a one-piece body may advantageously eliminate additional surfaces, which may otherwise contribute to flaking of deposited materials if the shield 174 is formed of multiple pieces. In some embodiments, the shield 174 is a one-piece body formed of aluminum. In another implementation, the shield 174 is a one-piece body formed of stainless steel coated with aluminum.

In embodiments, the shield 174 has a coating layer 204 formed on an interior surface 213 of the shield 174. The interior surface 213 referred herein includes the exposed surfaces of the shield 174 facing the substrate support pedestal 102 (FIG. 1). For example, in some embodiments, the coating layer 204 disposed may extend along the longitudinal direction of a portion or entire portion of the first annular leg 265 on a surface 206 of the first annular leg 265. In some embodiments, the coating layer 204 may extend to an upper surface 207 of the horizontal leg 264, or even extend to an inner surface 209 of the second annular leg 263. In embodiments, the exterior surface of the shield 174 is free from the coating layer. In some embodiments, the coating layer 204 may be formed on an outer surface 211 of the second annular leg 263. If desired, the coating layer 204 may be formed on all exposed surfaces of the shield 174. In embodiments, coating layer 204 comprises or consists essentially of or consists of aluminum oxide.

In some embodiments, the coating layer 204 includes the same material as the sputtering target such as target 106 (FIG. 1). For example, if the target 106 is fabricated from dielectric material such as material suitable for forming an ovonic threshold switch (OTS) layer including a compound of germanium (Ge), arsenic (As), and selenium (Se) such as $Ge_x$ and $Se_{1-x}$, wherein x is greater than 0 and smaller than 1, $Ga_2Te_3$, $In_2Te_3$, or $As_2Se_3$, the coating layer 204 will also be the same material. Therefore, the coating layer 204 includes the same material as the film to be deposited on the substrate surface from the target 106. The coating layer 204 may be at least 99.95% pure. In embodiments, the coating layer 204 may have a predetermined dielectric constant between 10 and 12. In embodiments, the predetermined dielectric constant between 10 and 12 matches or is substantially similar to the dielectric constant of the target 106 (FIG. 1).

In embodiments, depending upon the material of the target 106, the coating layer 204 may contain an ovonic threshold switch (OTS) layer including a compound of germanium (Ge), arsenic (As), and selenium (Se) such as $Ge_x$ and $Se_{1-x}$, wherein x is greater than 0 and smaller than 1, $Ga_2Te_3$, $In_2Te_3$, $As_2Se_3$, or the like. In one embodiments, the coating layer 204 is preselected to have a dielectric constant substantially similar to the target material, e.g. ±3. In embodiments, coating layer 204 is aluminum oxide preselected to have a dielectric constant substantially similar to the target material, e.g. ±3, ±2, or ±1.

In some embodiments, the material of the coating layer 204 is aluminum oxide, or other material comprising the target 106. The coating layer 204 may be a single layer of the material listed above, or may be multiple layers of the same material or different materials listed above.

In embodiments, the shield 174 may be fabricated by depositing an aluminum oxide layer on a core material such as aluminum. In embodiments, the shield 274 is pre-coated with the same material including the sputtering target material prior to installation in the processing chamber 200 or with aluminum oxide having a dielectric constant substantially similar to the sputtering target material. By using a pre-coated shield such as shield 174, the aluminum material comprising the shield 174 is not exposed during processing, which may reduce the possibility of aluminum contamination on substrate surface. Moreover, an aluminum oxide shield may have a substantially similar dielectric constant to that of the target material significantly to reduce or substantially reduce the burn-in time to hours instead of days or weeks.

In some embodiments, the overall thickness of the coating layer 204 may be within a range from about 50 to 500 micrometers, such as about 100 micrometers to about 200 micrometers. In one embodiment, the coating layer 204 has a thickness of about 75 micrometers to about 150 micrometers. The thickness of the coating layer 204 may vary depending upon the processing requirements, or the desired coating life. In some embodiments, the coating layer 204 comprises or consists of an aluminum oxide having a thickness of about 100 micrometers to about 200 micrometers.

In some embodiments, coating layer 204 may be applied to the shield 174 prior to installation of the shield 174 in the processing chamber 100. The coating layer 204 may be deposited, plated, or otherwise formed on the interior surface 206 of the shield 174 using any suitable technique. For example, the coating layer 204 may be formed on the interior surface 206 by a deposition process, such as a plasma spray process, a sputtering process, a PVD process, a CVD process, a PE-CVD process, an ALD process, a PE-ALD process, an electroplating or electrochemical plating process, an electroless deposition process, or derivatives thereof. In other embodiments, the coating layer 204 may be applied to the shield 174 prior to processing a substrate within the processing chamber 100.

In some embodiments, prior to formation of the coating layer 204 onto the shield 174, the interior surface 206 or at least the exposed surfaces of the shield 174 (to be deposited with the coating layer 204) may be roughened to have any desired texture by abrasive blasting, which may include, for example, bead blasting, sand blasting, soda blasting, powder blasting, and other particulate blasting techniques. The blasting may also enhance the adhesion of the coating layer 204 to the shield 174. Other techniques may be used to roughen the interior surface 206 or at least the exposed surfaces of the shield 174 including mechanical techniques (e.g., wheel abrasion), chemical techniques (e.g., acid etch), plasma etch techniques, and laser etch techniques. The interior surface 206 or at least the exposed surfaces of the shield 174 (to be deposited with the coating layer 204) may have a mean surface roughness within a range from about 80 microinches to about 500 microinches.

FIG. 3 is a method 300 for preparing a shield surface prior to using a shield for sputtering, including at 302, prior to burn-in: coating an inner surface of a shield with aluminum oxide to produce an aluminum oxide coating having a predetermined dielectric constant. In embodiments, the method 300 includes treating a shield for use in a processing chamber, such as the shield 174 and the processing chamber 100, described above. In embodiments, the method 300 may include providing an annular body defining an opening surrounded by the body. Specifically, the body is a hollow body having a cylindrical shape, and is fabricated to have a first annular leg, a second annular leg relatively shorter than the first annular leg, and a horizontal leg connecting the second annular leg to the first annular leg at the lower portion of the first annular leg, as generally shown in FIG. 2. In embodiments, the body is manufactured from aluminum, stainless steel, aluminum oxide, aluminum nitride, or ceramic. In one embodiment, the body is manufactured from aluminum. In one embodiment, the body is a one-piece body formed of aluminum. In another embodiment, the body is a one-piece body formed of stainless steel coated with aluminum. The body has an inner diameter selected to accommodate the size of a substrate support, such as the substrate support pedestal 133 shown in FIG. 1.

In embodiments, the method 300 may include, a coating layer such as an aluminum oxide coating formed on interior surface of the body by a deposition process, such as such as a plasma spray process, a sputtering process, a PVD process, a CVD process, a PE-CVD process, an ALD process, a PE-ALD process, an electroplating or electrochemical plating process, an electroless deposition process, or derivatives thereof. The interior surface of the body includes exposed surfaces facing the substrate support in the processing chamber, such as the interior surface 206 of the first annular leg 265, the upper surface 207 of the horizontal leg 264, the inner surface 209 of the second annular leg 263, and/or the outer surface 211 of the second annular leg 263 as shown in FIGS. 1 and 2. In some embodiment, the coating layer is formed on the interior surface of the body by plasma spraying. The plasma spray may be performed in vacuum environment to enhance the purity and density of the coating. In some embodiments, the coating layer is or contains the same material, such as a dielectric material, as the film to be deposited on a substrate surface from a sputtering target disposed within the processing chamber. In one implementation, the coating layer is formed from a material that is at least 99.95% as pure as the sputtering target material. The coating layer may contain a dielectric material, as discussed above with respect to FIG. 2.

In embodiments, the method 300 may further include, roughening the coating layer to a desired texture by abrasive blasting, which may include, for example, bead blasting, sand blasting, soda blasting, powder blasting, and other particulate blasting techniques. Alternatively, the coating layer may be textured by another technique, such as but not limited to wet etching, dry etching, and energy beam texturing, among others.

In embodiments, the method 300 may include, a body having the coating layer deposited on the interior surfaces is installed in the processing chamber, prior to processing a substrate within the processing chamber (i.e., the substrate is not being present in the processing chamber).

In embodiments, the present disclosure relates to a physical vapor deposition assembly, including, prior to burn-in: a dielectric target having a first dielectric constant; and a shield for reducing burn-in time prior to sputtering, including: an aluminum oxide coating disposed upon an inner surface of a shield, wherein the shield has a second dielectric constant substantially similar to the first dielectric constant. In some embodiments, the inner surface of the shield is aluminum. In some embodiments, the shield comprises aluminum. In some embodiments, the aluminum oxide coating has a thickness of about 100 micrometers to about 200 micrometers. In some embodiments, the aluminum oxide coating has a porosity of less than 4%. In some embodiments, the aluminum oxide coating has a surface RA of about 300 to 450 microinch (μin). In some embodiments, the aluminum oxide coating has the same or substantially similar dielectric constant as an ovonic threshold switch (OTS) layer material including a compound of germanium (Ge), arsenic (As), and selenium (Se) such as $Ge_x$ and $Se_{1-x}$, wherein x is greater than 0 and smaller than 1, $Ga_2Te_3$, $In_2Te_3$, $As_2Se_3$, or the like. In some embodiments, an aluminum oxide coating such as coating layer 204 is preselected to have a dielectric constant substantially similar to the target material, e.g. ±3. In embodiments, coating layer 204 is aluminum oxide preselected to have a dielectric constant substantially similar to the target material, e.g. ±3, ±2, or ±1.

FIG. 4 depicts a flow chart for a method of reducing burn-in time of a physical vapor deposition shield. In embodiments, a method for reducing burn-in time of a physical vapor deposition shield, includes at 402 sputtering a dielectric target having a first dielectric constant to form a dielectric layer upon an inner surface of a shield, wherein the shield includes an aluminum oxide coating having a second dielectric constant in an amount sufficient to reduce the burn-in time, and wherein the first dielectric constant and second dielectric constant are substantially similar.

In some embodiments, the inner surface of the shield is aluminum. In some embodiments, the shield comprises aluminum. In some embodiments, the aluminum oxide coating has a thickness of about 100 micrometers to about 200 micrometers. In some embodiments, the aluminum oxide coating has a porosity of less than 4%. In some embodiments, the aluminum oxide coating has a surface RA of about 300 to 450 microinches (μin). In some embodiments, the aluminum oxide coating has a hardness of greater than 8 GPa@100 gm load. In some embodiments, the aluminum oxide has a Vickers Hardness (HV) between 7-9 GPa. In some embodiments, the aluminum oxide coating reduces burn-in. In some embodiments, the method 400 includes positioning the shield within a physical vapor deposition chamber comprising a target having a second dielectric constant, wherein the first dielectric constant and second dielectric constant are within a range of ±2. In some embodiments, the dielectric target comprises a dielectric material comprising one or more of germanium (Ge), arsenic (As), selenium (Se), and combinations thereof.

In some embodiments, the present disclosure relates to a computer readable medium having instructions stored thereon which, when executed, cause a physical vapor deposition chamber to perform a method for reducing burn-in time of a physical vapor deposition shield, including: sputtering a dielectric target having a first dielectric constant to form a dielectric layer upon an inner surface of a shield, wherein the shield comprises an aluminum oxide coating having a second dielectric constant in an amount sufficient to reduce the burn-in time, and wherein the first dielectric constant and second dielectric constant are substantially similar.

In some embodiments, the present disclosure relates to a computer readable medium having instructions stored thereon which, when executed, cause a semiconductor processing chamber to perform a method for preparing a shield surface prior to using a shield for sputtering, including coating an inner surface of a shield with aluminum oxide to produce an aluminum oxide coating having a predetermined dielectric constant. The predetermined dielectric constant may be substantially similar to a dielectric constant of a material to be sputtered in a subsequent deposition process, such as any of the processes disclosed above.

While the foregoing is directed to embodiments of the present disclosure, other and further embodiments of the disclosure may be devised without departing from the basic scope thereof.

The invention claimed is:

1. A physical vapor deposition assembly, comprising:
   a shield comprising an inner surface having a coating comprising aluminum oxide having a dielectric constant equal to ±3 of a dielectric constant of a first dielectric material present on a dielectric target;
   wherein a thickness and a surface roughness of the coating comprising aluminum oxide are configured to produce a burn-in time prior to sputtering of less than or equal to about 3 kilowatt hours,
   wherein the first dielectric material and the coating comprising aluminum oxide are different materials;
   wherein the coating comprising aluminum oxide has a porosity of less than 4%;
   wherein the coating comprising aluminum oxide has a thickness of about 50 micrometers to about 500 micrometers; and
   wherein the coating comprising aluminum oxide has a surface RA of about 80 to 500 microinch (μin).

2. The physical vapor deposition assembly of claim 1, wherein the coating comprising aluminum oxide has a dielectric constant equal to ±1 of the dielectric constant of the first dielectric material.

3. The physical vapor deposition assembly of claim 1, wherein the dielectric constant of the first dielectric material is from about 10 to 12.

4. The physical vapor deposition assembly of claim 1, wherein the coating comprising aluminum oxide has a thickness of about 100 micrometers to about 200 micrometers.

5. The physical vapor deposition assembly of claim 1, wherein the coating comprising aluminum oxide has a surface RA of about 300 to 450 microinch (μin).

* * * * *